(12) United States Patent
Muramatsu et al.

(10) Patent No.: US 7,626,832 B2
(45) Date of Patent: Dec. 1, 2009

(54) ELECTROMAGNETIC WAVE SHIELD CASE AND A METHOD FOR MANUFACTURING ELECTROMAGNETIC WAVE SHIELD CASE

(75) Inventors: Naokuni Muramatsu, Nagoya (JP); Akihisa Inoue, Kawauchi-Juutaku 11-806, Kawauchimotohasekura 35 Banchi, Aoba-ku, Sendai-city, Miyagi-ken, 980-0861 (JP); Tao Zhang, Beijing (CN); Hisamichi Kimura, Miyagi-ken (JP)

(73) Assignees: NGK Insulators, Ltd., Nagoya (JP); Akihisa Inoue, Sendai (JP)

( * ) Notice: Subject to any disclaimer, the term of this patent is extended or adjusted under 35 U.S.C. 154(b) by 396 days.

(21) Appl. No.: 11/025,794

(22) Filed: Dec. 29, 2004

(65) Prior Publication Data

US 2005/0162842 A1    Jul. 28, 2005

(30) Foreign Application Priority Data

Jan. 8, 2004   (JP) .......................... P2004-002995

(51) Int. Cl.
*H05K 9/00* (2006.01)
(52) U.S. Cl. ...................................... 361/818; 361/816
(58) Field of Classification Search ................. 361/800, 361/816, 818, 810; 174/35 R, 51
See application file for complete search history.

(56) References Cited

U.S. PATENT DOCUMENTS

| | | | | |
|---|---|---|---|---|
| 4,340,770 A | * | 7/1982 | Bridges et al. ............... | 174/350 |
| 5,045,637 A | * | 9/1991 | Sato et al. .................... | 174/391 |
| 5,521,609 A | * | 5/1996 | Desch et al. ................. | 343/788 |
| 5,536,905 A | * | 7/1996 | Redman et al. .............. | 174/372 |
| 5,748,455 A | * | 5/1998 | Phillips et al. ............... | 361/818 |
| 5,825,606 A | * | 10/1998 | Villain et al. ................ | 361/220 |
| 6,031,732 A | * | 2/2000 | Koike et al. ................. | 361/816 |
| 6,271,465 B1 | * | 8/2001 | Lacey .......................... | 174/358 |
| 6,292,373 B1 | * | 9/2001 | Li et al. ....................... | 361/800 |
| 6,524,120 B2 | * | 2/2003 | Zhao ............................ | 439/95 |
| 6,683,796 B2 | * | 1/2004 | Radu et al. ................... | 361/818 |
| 6,821,578 B2 | * | 11/2004 | Beele .......................... | 427/573 |
| 7,142,435 B2 | * | 11/2006 | Goto et al. ................... | 361/818 |
| 2002/0113380 A1 | * | 8/2002 | Clark .......................... | 277/650 |
| 2006/0137778 A1 | * | 6/2006 | Munir et al. ................. | 148/561 |
| 2008/0152745 A1 | * | 6/2008 | Nguyen et al. ................ | 425/46 |

FOREIGN PATENT DOCUMENTS

EP         0 092 091        10/1983

(Continued)

*Primary Examiner*—Hung S Bui
(74) *Attorney, Agent, or Firm*—Burr & Brown

(57) ABSTRACT

An objective of the present invention is to form a hyper-elastic flange integrally within a shield case body around a periphery thereof while decreasing an occupied area for grounding. The shield case 2 according to the present invention is disposed to cover electronic parts 6 on a circuit board 1, and which has a flange 7 formed integrally therewith so as to contact with a metallic ground line 3 on the circuit board 1. The flange 7 is elastically deformed to be grounded, thus a leakage of electromagnetic waves to the outside of the shield case 2 is prevented. The flange 7 is made of metallic glass. By forming the flange 7 from metallic glass, a displacement due to viscous flowing on the atomic level, which is different from a plastic deformation, can be utilized, and thus a high precision flange can be formed without a spring-back.

15 Claims, 11 Drawing Sheets

FOREIGN PATENT DOCUMENTS

| | | |
|---|---|---|
| EP | 1 063 312 | 12/2000 |
| FR | 2806019 | 9/2001 |
| JP | 11012490 | 1/1999 |
| JP | 11071656 | 3/1999 |
| JP | 2000-129378 A1 | 5/2000 |
| JP | 2000-178700 A1 | 6/2000 |
| JP | 2003-179378 A1 | 6/2003 |
| JP | 2003-179379 A1 | 6/2003 |
| WO | 00/48440 | 8/2000 |
| WO | 01/99483 | 12/2001 |
| WO | 02/052916 | 7/2002 |
| WO | 03/013207 | 2/2003 |

\* cited by examiner

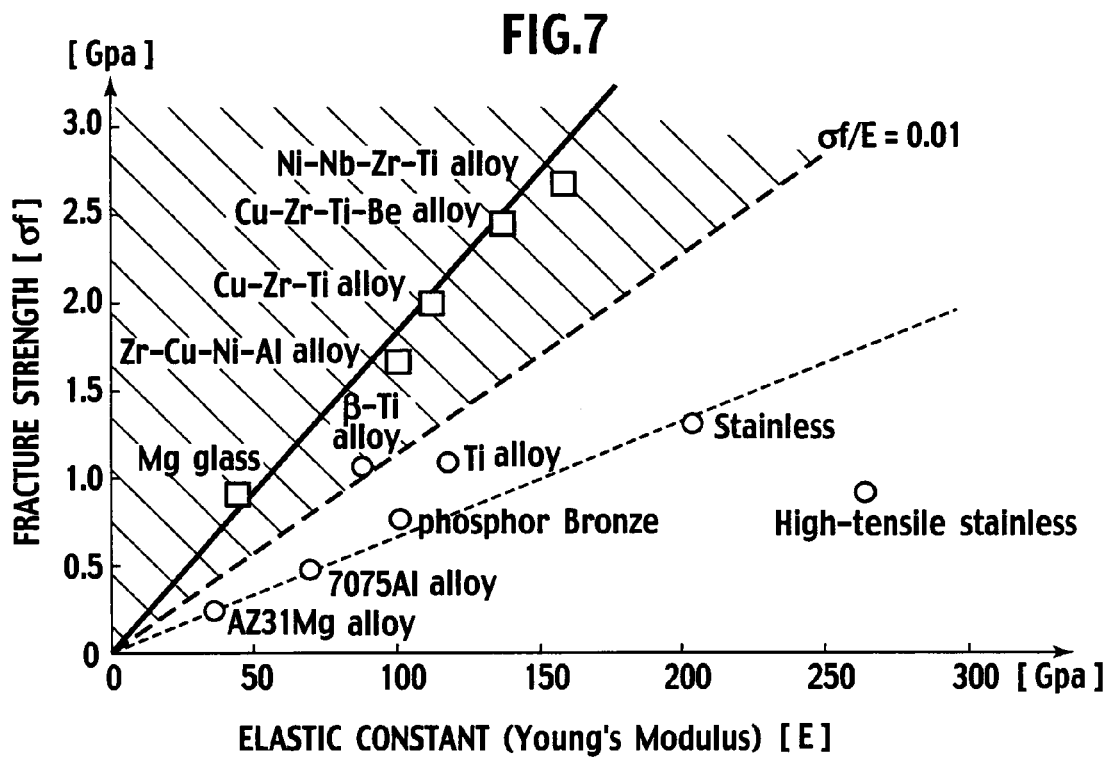
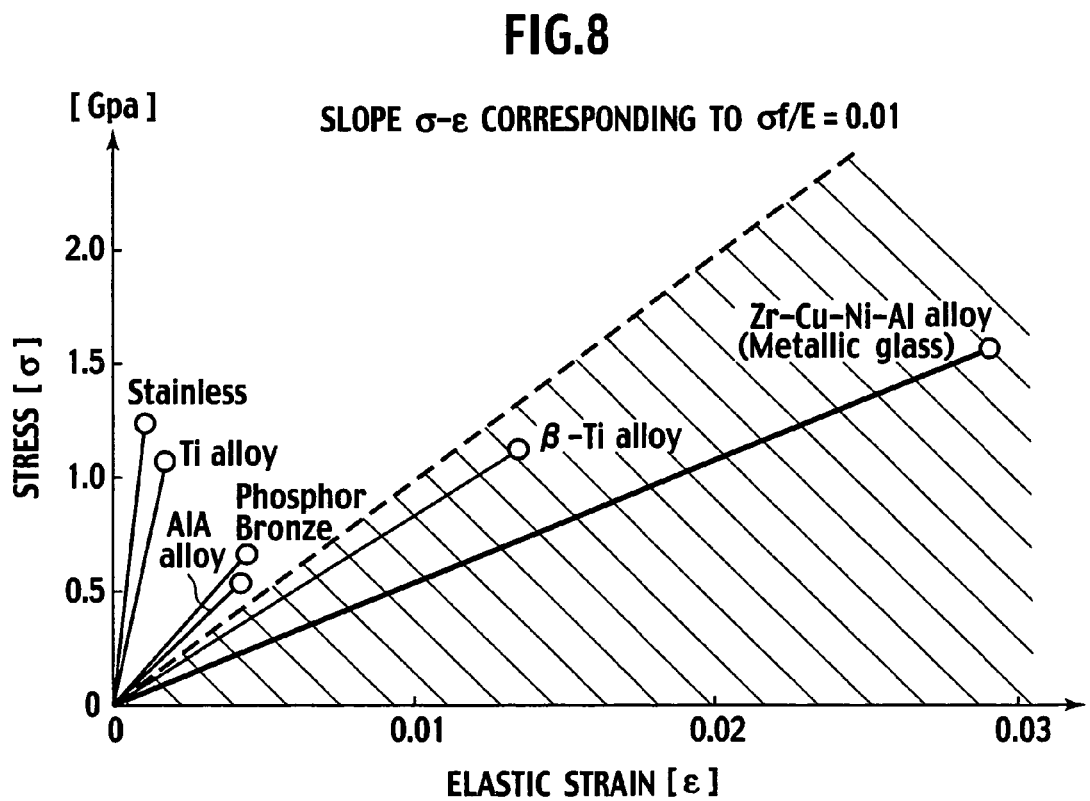

ELECTROMAGNETIC WAVE SHIELD CASE AND A METHOD FOR MANUFACTURING ELECTROMAGNETIC WAVE SHIELD CASE

CROSS REFERENCE TO RELATED APPLICATIONS

This application is based upon and claims the benefit of priority from the prior Japanese Patent Applications No. P2004-2995, filed on Jan. 8, 2004; the entire contents of which are incorporated herein by reference.

BACKGROUND OF THE INVENTION

1. Field of the Invention

The present invention relates to an electromagnetic wave shield case disposed to cover electronic parts on a circuit board (printed circuit board) used for a cellular phone and a computer, and an electromagnetic wave shield case manufacturing method.

2. Description of the Related Art

When electronic parts such as an oscillator for generating electromagnetic waves are present on a circuit board, preventing influence on other circuit devices due to electromagnetic waves is required.

Specifically, in order to prevent occurrence of radiation noise, technologies have been identified that shielding the electronic parts so as not to propagate generated electromagnetic waves to the outside by surrounding the electronic parts with an electromagnetic wave shield case essentially made of metallic materials, which are of a conductive substance.

When such an electromagnetic wave shield case (hereinafter referred to as "shield case" when appropriate) is located on the circuit board, as shown in FIG. 1, a metallic ground line 3 (portion conducted to the earth ("grounding conduction portion", hereinafter)) is provided in a region on a circuit board 1 corresponding to the lowermost portion of a shield case 50A and around it. The metallic ground line 3, and the lowermost portion of the shield case 50A, or part of the lowermost portion thereof are joined by soldering, and a soldering joint portion 4 is formed.

However, joining of the shield case 50A to the metallic ground line 3 by soldering has the following problems. That is, in a solder joining method, the following problems can be enumerated:

(a) adverse affects, which include deformation and partial breakage of the printed circuit board and electronic parts due to heating when soldering;

(b) an inefficient job of removing soldering from the shield case 50A when the shield case 50A on the circuit board 1 is used as a recycled product after its validity has expired;

(c) a troublesome job of performing treatments such as washing before and after the soldering is performed;

(d) fluxes, dispersal of soldering, and sticking of dispersed soldering on circuit elements at the stage of soldering; and (e) the necessity to remove the soldering and detach the shield case 50A when electronic parts within the shield case 50A are replaced. Accordingly, various technologies have been heretofore proposed. Prior Art #1 solves the problem (e), and according to the Prior Art #1, as shown in FIG. 2, a truss-shaped frame 5 is joined to the metallic ground line 3 by soldering, and a so called two-piece type shield case 50B in which the truss-shaped frame 5 and a detachable upper cover 60 are combined.

Prior Art #2, which was developed by the Inventors of this application, solves the problems (a) to (e), whereby a shield case, in which an anchor pin integrally united thereto without soldering and has bending elasticity, is elastically joined to a through hole provided in a circuit board (for example, Japanese Patent Application Laid-open No. 2003-179378).

Prior Art #3 was also developed by the Inventors of this application to solve the problems (a) to (e). According to Prior Art #3, a lock pin having bending elasticity, which is integrally united with a back surface of a shield case without soldering, is elastically jointed to a housing for a circuit board. In Prior Art #3, a structure, in which part of the lowermost end of the shield case is made conductive by allowing the part to contact with a metallic ground line, is adopted (for example, Japanese Patent Application Laid-open No. 2003-179379).

Zr group amorphous alloy (metallic glass) having high amorphous forming ability as well as high strength and ductility, which has been developed by the Inventors of this application, has also been known (for example, Japanese Patent Application Laid-open Nos. 2000-129378 and 2000-178700).

BRIEF SUMMARY OF THE INVENTION

However, Prior Art #1 has a problem in that the height of the shield case 50B is apt to be high, and a reduction in the thickness of the circuit board 1 is disturbed, resulting in a high cost of manufacturing.

In cellular phones and computers in which the thickness has become rapidly thinner, limitations with respect to their spaces are brought due to the layout of electronic parts. Further, electronic parts may be mounted on the back face of a circuit board due to diffusion of a double-sided mount board. Therefore, provisioning of the number of through holes, which is necessary and sufficient, on a circuit board has come to be no longer permitted, and a new problem in that Prior Art #2, cannot be applied is occurring.

Although Prior Art #3 does not require provision of a through hole in a circuit board, Prior Art #3 has the following new problem regarding realization of a reliable electric connection of the shield case and the metallic ground line.

Specifically, in order to absorb distortion of the housing and the circuit board (printed circuit board) made thinner, and to realize the electric connection of the shield case and the metallic ground line with high reliability, it is necessary to make the elastic spring displacement of the shield case larger.

Further, since a frequency band used for radio communications begins to have higher frequency, a grounding interval for the shield case and the metallic ground line is required to be shorter.

In order to meet these two requirements, in Prior Art #3, while being restricted with respect to the space required for grounding of the shield case, the grounding interval for the shield case and the metallic ground line will be made extremely short. Therefore, in a conventional sheet metal processing method used after the metal is press-punched, in which the metal is formed by bending, a new problem arises in that design of the shield case has become difficult.

Specifically, design of the shield case which meets the requirements including mass productivity by press-punching and bend-forming, the shorter grounding interval, a decrease in the occupied area for grounding, and provision of a large elastic spring displacement, becomes extremely difficult.

In order to manufacture the shield case, in a conventional method in which a crystalline metallic material is formed by bending or deep drawing by means of a plastic deformation, there is a limit in securing a sufficient elastic deformation while keeping the flare width and the bending radius of the shield case small.

In order to solve not only the conventional problems (a) to (e) but also the new problems related to Prior Art #1 to #3, an objective of the present invention is to provide an electromagnetic wave shield case and an electromagnetic wave shield case manufacturing method, which needs no through hole and is capable of securing a large elastic spring displacement while decreasing an occupied area for grounding.

As a result of examinations, the Inventors of this application acquired the knowledge that a high precision flange can be formed without a spring-back by use of a deformation due to viscous flowing on the atomic level, which is different from a plastic deformation, using metallic glass. The inventors then accomplished the present invention base on the knowledge.

In order to achieve the objective, a first aspect of the present invention is an electromagnetic wave shield case comprising a shield case body configured to cover electronic parts on a circuit board, and a flange formed integrally with said shield case body, wherein said shield case body and said flange are made of metallic material having a value of about 0.01 or more expressed by a fracture strength/elastic constant, and said flange is elastically deformed to be grounded to an grounding conduction portion on said circuit board to prevent a leakage of electromagnetic waves to outside of said electromagnetic wave shield case.

Herein, the fracture strength means one defined by a yield stress in a mechanical strength test or a stress which is an elastic limit. The elastic constant is one defined by a proportionality constant with respect to a stress and a strain within the elastic limit.

According to the first aspect of the present invention, since the electromagnetic wave shield case is made of the metallic material having the value of about 0.01 or more expressed by a fracture strength/elastic constant, a deformation due to viscous flowing on the atomic level which is different from a plastic deformation can be utilized, and thus a high precision flange can be formed without a spring-back.

A second aspect of the present invention is the electromagnetic wave shield case according to the first aspect, wherein said flange has a flare width of 1 mm or less (not more than 1 mm).

A third aspect of the present invention is the electromagnetic wave shield case according to the second aspect, wherein said flange has at least one cut along a direction of the flare width.

A fourth aspect of the present invention is the electromagnetic wave shield case according to the first aspect, wherein said flange has a nonlinear external periphery portion.

A fifth aspect of the present invention is an electromagnetic wave shield case comprising a shield case body configured to cover electronic parts on a circuit board, and a flange formed integrally with said shield case body, wherein, said shield case body and said flange are made of metallic glass, and said flange is elastically deformed to be grounded to an grounding conduction portion on said circuit board to prevent a leakage of electromagnetic waves to outside of said electromagnetic wave shield case.

According to the fifth aspect of the present invention, since the electromagnetic wave shield case is manufactured using metallic glass, it is possible to utilize a deformation due to viscous flowing on the atomic level which is different from a plastic deformation, and thus a high precision flange can be formed without a spring-back.

A sixth aspect of the present invention is the electromagnetic wave shield case according to the fifth aspect, wherein said flange has a flare width of 1 mm or less (not more than 1 mm).

A seventh aspect of the present invention is the electromagnetic wave shield case according to the sixth aspect, wherein said flange has at least one cut along a direction of said flare width.

An eighth aspect of the present invention is the electromagnetic wave shield case according to the fifth aspect, wherein said flange has a nonlinear external periphery portion.

A ninth aspect of the present invention is the electromagnetic wave shield case according to the fifth aspect, wherein said metallic glass is a zirconium base alloy having amorphous structure.

A tenth aspect of the present invention is a method for manufacturing an electromagnetic wave shield case according to claim 5, wherein said electromagnetic wave shield case is made by pressure forming in a supercooled liquid temperature region of said metallic glass to be used for said electromagnetic wave shield case.

An eleventh aspect is a method for manufacturing an electromagnetic wave shield case according to claim 5, wherein said electromagnetic wave shield case is made by warm pressing in a temperature region defined in between a glass transition temperature and a crystallization temperature of said metallic glass to be used for said electromagnetic wave shield case.

A twelfth aspect of the present invention is the method according to the tenth or eleventh aspects, wherein said metallic glass is a zirconium base alloy having amorphous structure.

According to such aspects, various forming methods represented by a die casting method and a high-pressure injection molding method can be selected without limits to the method of performing a deep drawing forming for a foil material using a single roller method.

Thus, it is possible to easily mold the shield case and the like, which has a dome shape, other shapes including a non-symmetrical shape, or which has a flange having an external periphery portion with non-straight lines.

BRIEF DESCRIPTION OF THE DRAWINGS

FIG. 7 is a graph showing a relation between the fracture strength of metallic materials and the elastic constant thereof;

FIG. 8 is a graph showing a relation between the stress of the metallic materials and the strain thereof;

DESCRIPTION OF THE PREFERRED EMBODIMENTS

Figure 1:
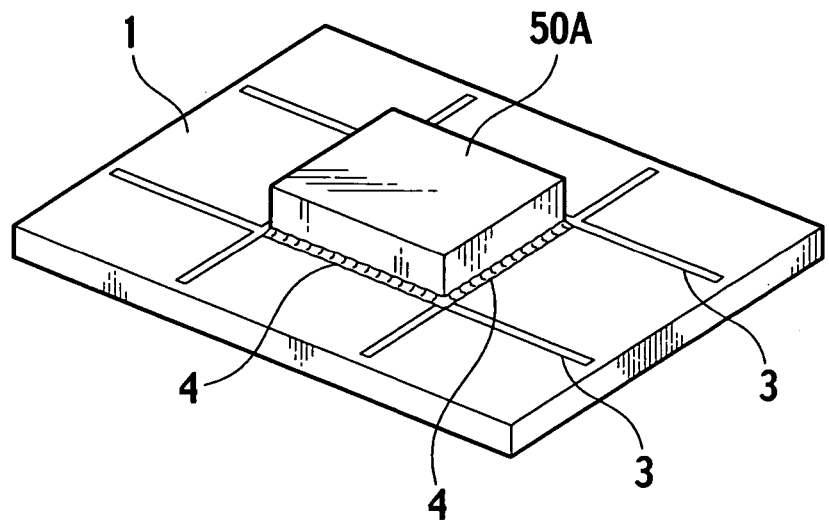
FIG. 1 is a view showing a state where a conventional electromagnetic wave shield case is grounded.
Figure 2:
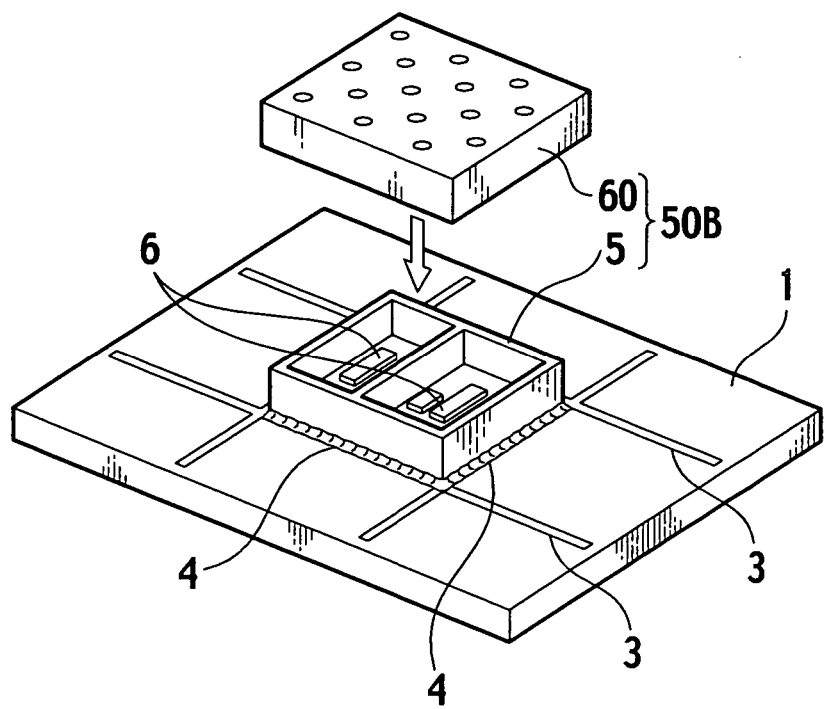
FIG. 2 is a view showing a state where another conventional electromagnetic wave shield case is grounded.

Embodiments of the present invention will be described below. Note that the same components as those in FIGS. 1 and 2 are denoted by the same reference numeral and symbols, and descriptions for them are omitted.

Figure 3:
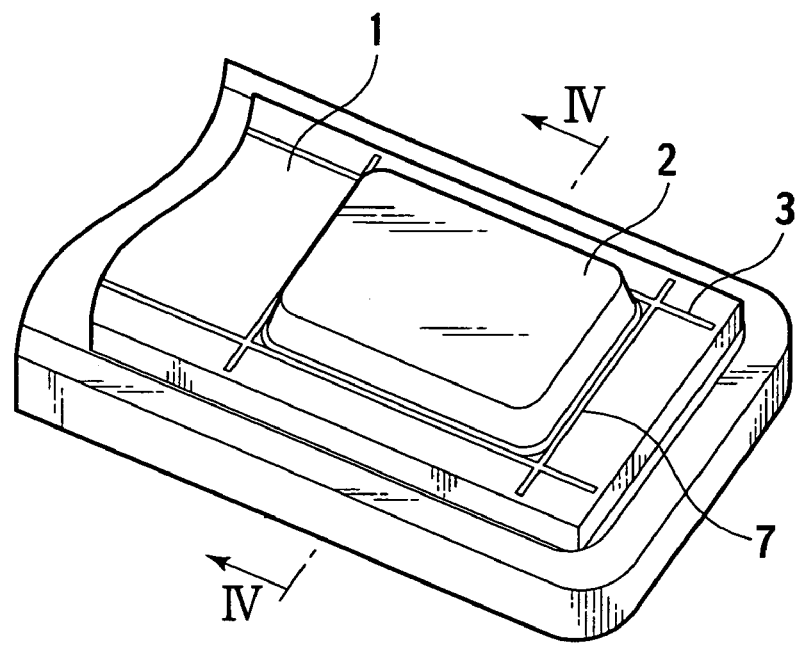
FIG. 3 is a schematic perspective view showing an electromagnetic wave shield case equipped with a circuit board according to an embodiment of the present invention.
Figure 4:
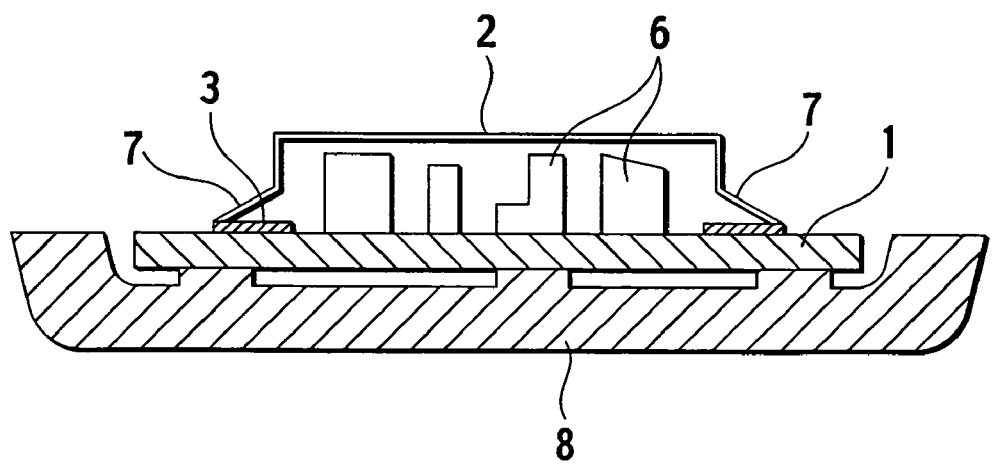
FIG. 4 is a schematic sectional view taken along the line IV-IV of FIG. 3.

FIGS. 3 and 4 show a shield case 2 shielding electromagnetic wave according to an embodiment of the present invention. The shield case 2 is disposed to cover electronic parts 6 on a circuit board 1. A flange 7 formed integrally with the shield case 2 (shield case body), which is elastically deformed to be grounded to a metallic ground line 3 (grounding conduction portion) on the circuit board 1, so that leakage of electromagnetic waves to the outside of the shield case 2 is prevented.

The flange 7 is manufactured integrally with the shield case 2. The shield case 2 and the flange 7 are made of metallic material having a value (ratio) of about 0.01 or more (not less than 0.01) expressed by a fracture strength($\sigma f$)/elastic constant(E).

Further, in this embodiment, the shield case 2 and the flange 7 are made of metallic material having a value of the fracture strength ($\sigma f$)/elastic constant (E) is about 0.1 or less. In other words, the value of the fracture strength($\sigma f$)/elastic constant(E) for the shield case 2 and the flange 7 is in the range of $0.01 \leq \sigma f/E \leq 0.1$.

It is preferable that a value of $\sigma f/E$ for the shield case 2 and the flange 7 is in the range of $0.01 \leq \sigma f/E \leq 0.05$.

Specifically, the shield case 2 is formed of a thin metallic foil, and the band-shaped flange 7, having a small width, is formed over the entire circumference of an open end of the shield case 2. The shield case 2 is placed on the metallic ground line 3 of the circuit board 1 housed within a housing 8 of an electronic device.

The shield case 2 can be manufactured by, for example, 55Zr-30Cu-5Ni-10Al alloy (the number symbols represent anatomic ratio). However, the material of the shield case 2 is not always limited to the alloy (metallic material). The material of the shield case 2 may be metallic material having the value (ratio) of about 0.01 or more expressed by the fracture strength ($\sigma f$)/elastic constant (E).

Herein, the fracture strength ($\sigma f$) means one defined by a yield stress in a mechanical strength test or a stress which is an elastic limit. The fracture strength ($\sigma f$) can be measured in accordance with JIS Z2241. The elastic constant (E) means a Young's modulus defined by a proportionality constant with respect to a stress and a strain within the elastic limit. For example, the elastic constant (E) can be measured by the method described in "Engineering Materials/An introduction to their properties and applications", M. F. Ashby and D. R. H. Jones, Cambridge University, England Pergamon Press.

The shield case 2 floats by spring of the flange 7 having an angle (see FIG. 4). In this state, there is a possibility of having a portion where the metallic ground line 3 and the flange 7 may not be connected electrically due to deflection of the circuit board 1.

Figure 5:
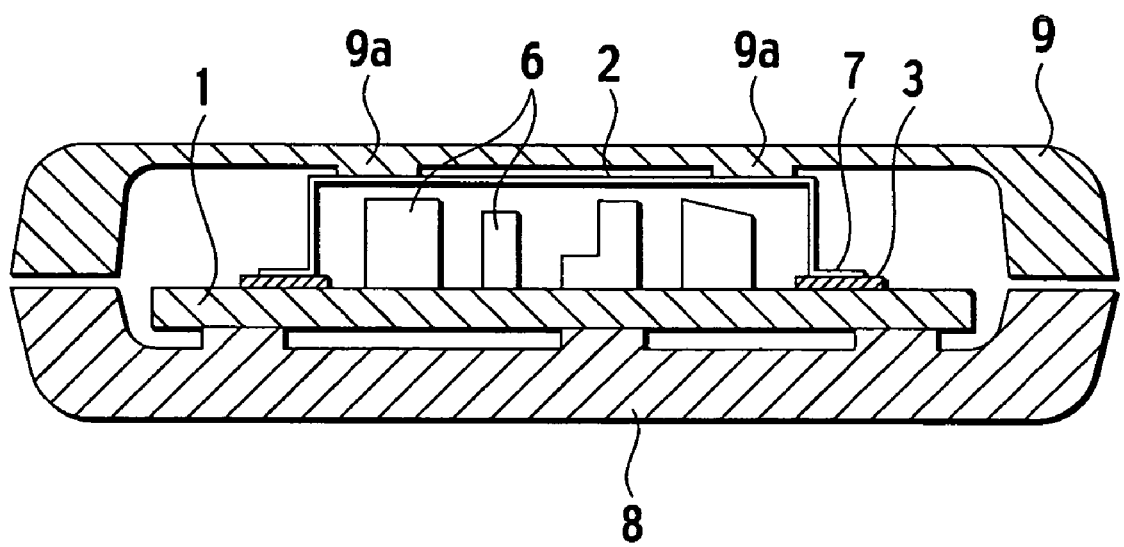
FIG. 5 is a view showing the electromagnetic wave shield case sandwiched by upper and lower housings in the sectional view taken along the line IV-IV of FIG. 3.

FIG. 5 shows the shield case 2 covered by a housing 9, and the electronic parts 6 are normally used in this state. The shield case 2 pressed against the housings 8 and 9 can allow the flange 7 to be grounded to the metallic ground line 3 by elastic deformation of the flange 7. The shield case 2 is pressed in its ceiling portion by a convex portion 9a provided on an internal plane of the housing 9.

Figure 6A:
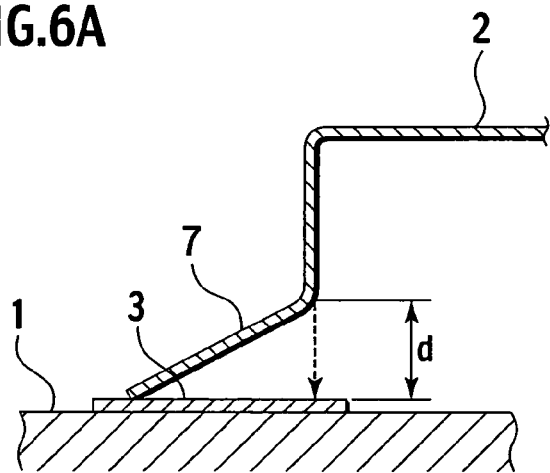
FIG. 6A is a view showing the electromagnetic wave shield case mounted on the circuit board at the time before it is pressed by the housings.
Figure 6B:
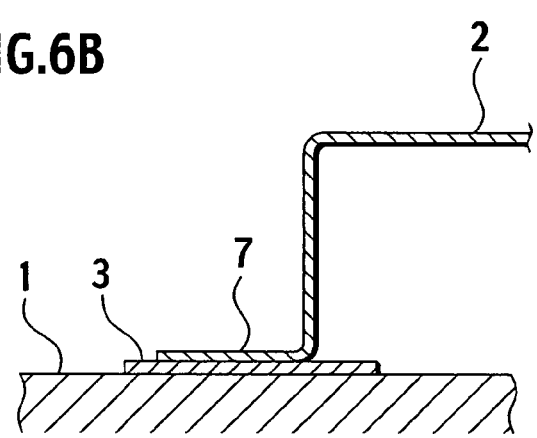
FIG. 6B is a view showing the electromagnetic wave shield case pressed by the housings.
Figure 6C:
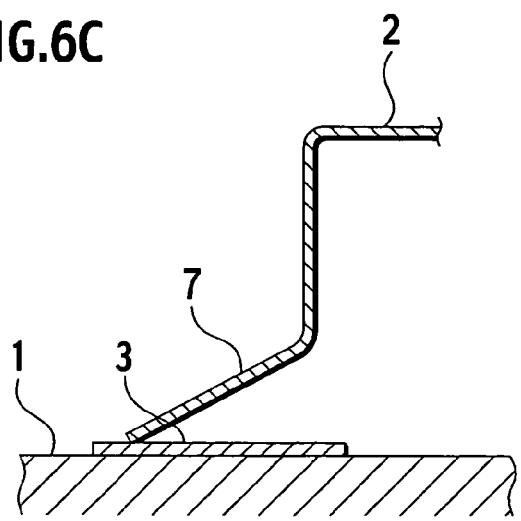
FIG. 6C is a view showing a state where the housings are detached and pressing of the shield case is relieved.

FIGS. 6A to 6C are explanatory views for explaining a motion of the flange 7 at the time when the shield case 2 is pressed by the convex portion 9a. FIG. 6A shows the shield case 2 mounted on the circuit board 1 at the time before the shield case 2 is pressed by the housing 9. The flange 7 is in a state where its tip is allowed to contact with the metallic ground line 3 and its base portion is allowed to be distant from the metallic ground line 3 by a distance "d".

FIG. 6B shows the shield case 2 pressed by the housing 9. The flange 7 is in a state where the entire portion ranging from the tip of the shield case 2 to the base portion thereof is allowed to contact with the metallic ground line 3.

FIG. 6C shows a state where the housing 9 is detached and pressing of the shield case 2 is relieved. The flange 7 restores to its original state of FIG. 6A. As described above, since the flange 7 is hyper-elastic, the flange 7 is never broken down and deformed permanently. Therefore, by attaching and detaching the housings 8 and 9, the shield case 2 can be easily fitted to the circuit board 1 and easily detached from the circuit board 1.

In order to realize the above described motion of the shield case 2, the shield case 2 is manufactured from metallic materials having a value of the fracture strength ($\sigma f$) /elastic constant (E), which is about 0.01 or more.

Specifically, as shown in FIG. 7, when a relation between the fracture strength ($\sigma f$) and the elastic constant (E) is observed on the graph, many of the structural metal materials such as stainless, titanium and aluminum alloy are scattered in value within a range of $\sigma f/E < 0.01$.

In a case where the shield case 2 having a thickness from 0.1 to 0.3 mm, which has commonly been used by manufactures, is shaped by selecting these metallic materials, it has been found that cracks are produced at the bending R portion when bending is performed for the flange 7 having a width of 1 mm. As a matter of course, though the shield case 2 can be manufactured by cutting a block material, such manufacturing of the shield case 2 is inefficient.

Contrary to this, the metallic material used in the shield case 2 and the flange 7 of the present invention are scattered in value in the range of $\sigma f/E > 0.01$ (which is illustrated by the slanted lines in FIG. 7). It is therefore possible to utilize a deformation due to viscous flowing on the atomic level, which is different from the plastic deformation, by manufacturing the shield case 2 from these metallic materials.

Thus, forming of the flange 7 having a high dimensional precision without a spring-back can be achieved without causing cracks at the bending R portion. Exemplifying the metallic materials of the present invention, Ni—Nb—Zr—Ti alloy, Cu—Zr—Ti—Be alloy, Cu—Zr—Ti alloy, Zr—Cu—Ni—Al alloy (metallic glass), Mg glass, β-Ti alloy and the like are mentioned.

Metallic materials having a small spring constant are more advantageous for forming the acute flange 7 having a very small flare. Accordingly, the reason why the metallic materials applied to the present invention are limited will be described.

FIG. 8 shows a graph showing an elastic deformation curve (stress-strain curve) of metallic materials. Since many of the aforementioned structural metallic materials including stainless, titanium, phosphor bronze, and aluminum alloy exhibit only slight elastic strains, they will be permanently deformed. The elastic strain ε is a natural logarithm of a quantity obtained by dividing an elastic deformation ΔS, which is caused by adding an external force, with an original length S, and expressed by ε=Ln(ΔS/S). In FIG. 8, the circle represents an elastic limit point.

Contrary to the above-described case, the metallic materials in the present invention are scattered in values within the range σf/E>0.01, that is, a range being delimited by and lower than the slope σ-ε corresponding to σf/E=0.01 (shown with slant lines in FIG. 8). These metallic materials can provide sufficiently larger elastic deformations than those of the above-described structural metallic materials.

Figure 9A:
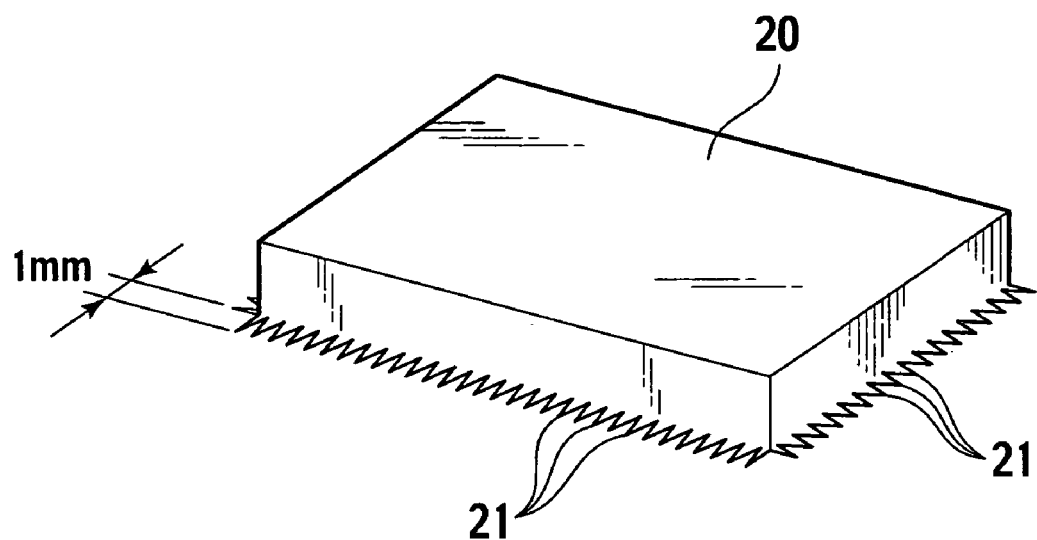
FIGS. 9A and 9B are perspective views of an electromagnetic wave shield case according to a comparative example.

Herein, as shown in FIG. 9A, a shield case 20 (comparative example) having a thickness of 0.1 to 0.3 mm was made of the aforementioned structural metallic material. The shield case 20 has a needle-shaped elastic springs 21, each of which sticks out by 1 mm, in its periphery portion. As shown in FIG. 9A, if the elastic springs 21 is formed to be radial-shaped, the shield case 20 can obtain only a slight spring displacement or permanently deforms before the spring displacement is obtained.

Figure 9B:
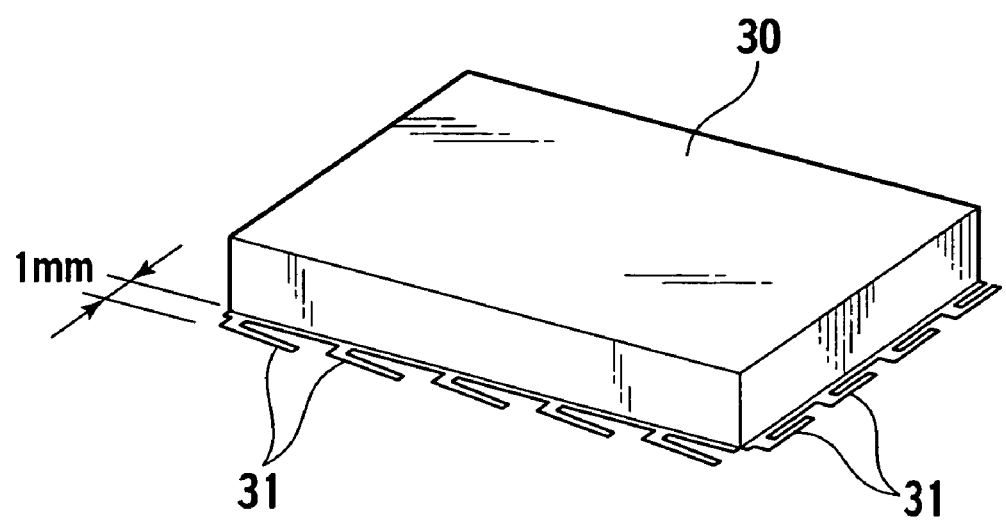

On the other hand, as shown in FIG. 9B, a shield case 30 (comparative example) was also made. The shield case 30 has sufficiently long L-shaped elastic springs 31 instead of the needle-shaped elastic springs 21. With the formation of the L-shaped elastic springs 31, a sufficient displacement is obtained even by the aforementioned structural metallic materials without the permanent deformation. In this case, the requirement for the high density grounding interval is not satisfied.

Contrary to this, since the shield case 2 is made of metallic material or metallic glass satisfying σf/E≧0.01, it is possible to easily realize the hyper-elastic band-shaped flange 7 having a flare width of not more than 1 mm.

It is preferable that the shield case 2 is formed so that the flange 7 has a flange width of not more than 1 mm.

Figure 10:
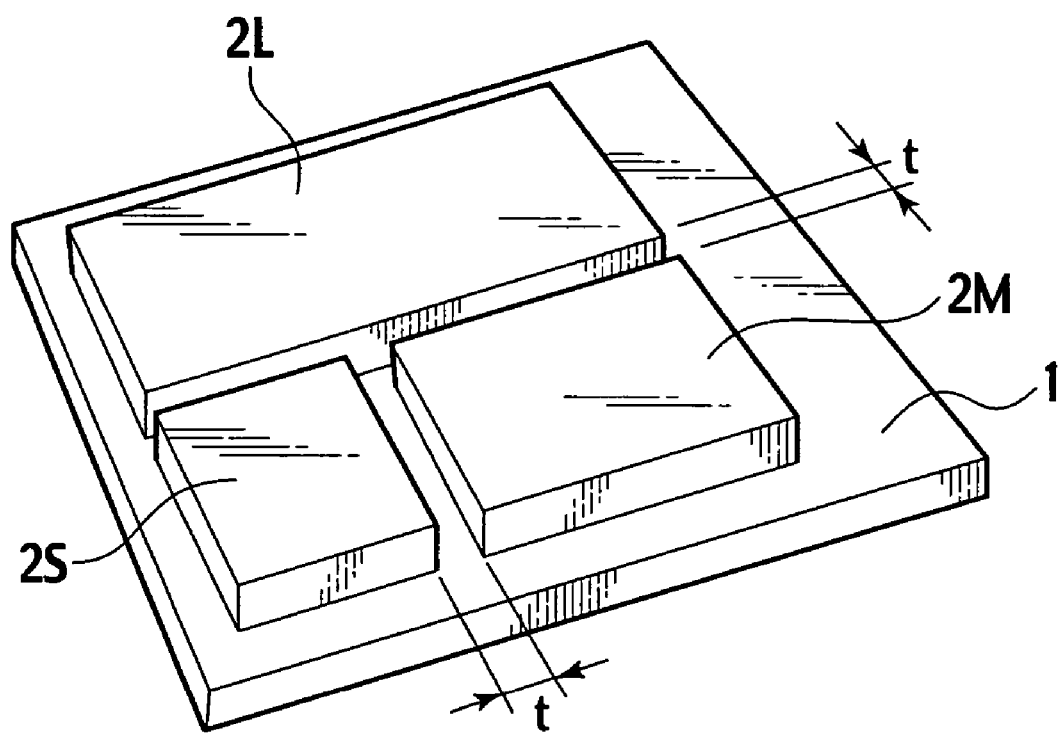
FIG. 10 is a schematic perspective view showing an arrangement example of the electromagnetic wave shield case on the circuit board.

As shown in FIG. 10, a plurality of shield cases, that is, shield cases 2S, 2M and 2L are often arranged adjacently for respective function regions of the circuit board 1. In this case, a joint margin of 1 mm, which is necessary for solder joint, is already achieved, and the interval "t" between the adjacent two shield cases is narrowed down to 2 mm. At this time, the flare width of the flange 7 being not less than 1 mm is never permitted considering the restriction of space on the circuit board 1. Specifically, this flare width provides no advantage unless it is not greater than 1 mm.

By making the shield case 2 from metallic material or metallic glass satisfying σf/E≧0.01, the shield case 2 having the flange 7 with the flange width being not more than 1 mm can be made satisfactorily.

Figure 11:
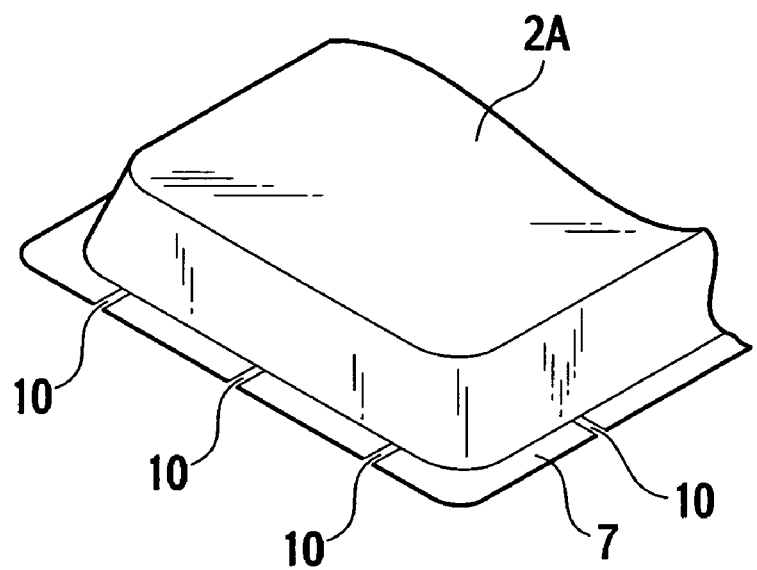
FIG. 11 is a partial perspective view of the electromagnetic wave shield case according to another embodiment of the present invention.

As a shield case 2A shown in FIG. 11, at least one cut 10 should be preferably provided along the direction of the flare width.

With such a constitution, a spring constant of the flange 7 can be controlled by the number of cuts 10. Therefore, it is possible to make the grounding of the shield case 2A (flange 7) and the metallic ground line 3 perfectly. Further, it is possible to achieve easiness in attachment and detachment of the housings 8 and 9 for housing the circuit board 1 and the shield case 2A.

Figure 12:
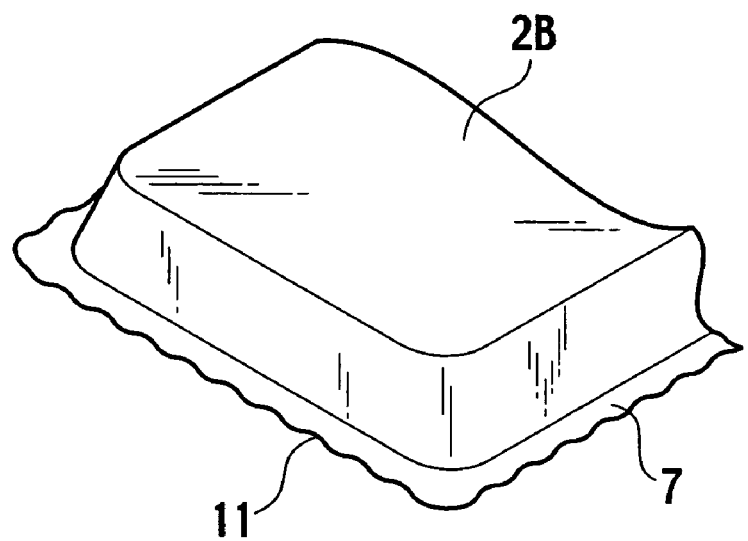
FIG. 12 is a partial perspective view of the electromagnetic wave shield case according to another embodiment of the present invention.

In a shield case 2B shown in FIG. 12, the flange 7 should be preferably formed to have a nonlinear external periphery portion 11. The external periphery portion 11 is not limited to one shaped with simple non-straight lines (wave form) as illustrated in FIG. 12, but the external periphery portion 11 may be a geometric pattern. Further, the flange 7 may have a space structure in which a circumferential length of the flange contacting with the metallic ground line 3 is long.

In this structure, the circumferential length of the external periphery portion 11 is long by forming the external periphery portion 11 to be shaped with non-straight lines. Therefore, a frictional force exerted between the and the metallic ground line 3 becomes large, and lateral sliding of the flange 7 can be prevented, and then positioning of the shield case 2B is achieved.

Moreover, modifications of the shield case 2 are illustrated in FIGS. 13 to 16. It is natural that any of these shield cases belongs to the present invention.

Figure 13:
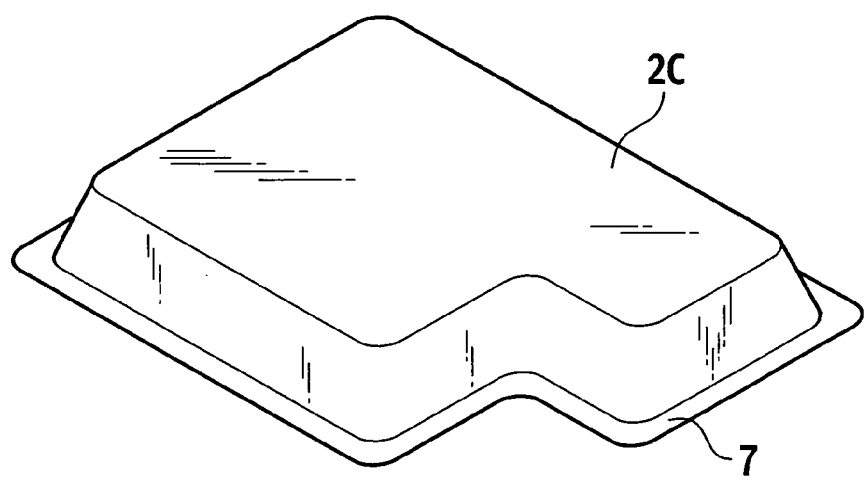
FIG. 13 is a perspective view of the electromagnetic wave shield case according to another embodiment of the present invention.

The shield case 2C illustrated in FIG. 13 has an asymmetrical shape as a whole, and can be easily made by adopting metal or metallic glass, each satisfying σf/E≧0.01. Further, as a matter of course, the shield case 2C can be made when the shield case 2C has a dome shape or another shape.

Figure 14:
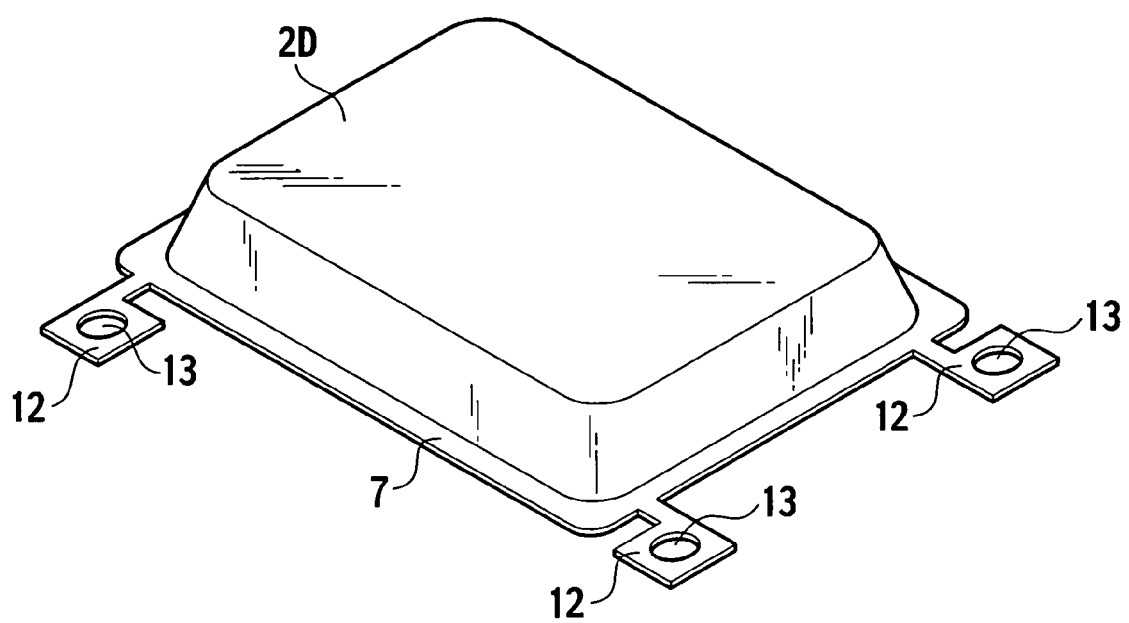
FIG. 14 is a perspective view of the electromagnetic wave shield case according to another embodiment of the present invention.

The shield case 2D illustrated in FIG. 14 has fixing pieces 12 in the flange 7, which are formed to protrude to the outside, and a hole 13 for positioning the shield case 2D with the circuit board 1 is provided in each fixing piece 12. The shield case 2D can be fixed to the circuit board 1 by allowing a screw to pass through the hole 13.

Furthermore, it is also possible to position the shield case 2D by inserting a protrusion (not shown) into the hole 13 provided in the circuit board 1 or the housing 8 (or the housing 9).

Figure 15:
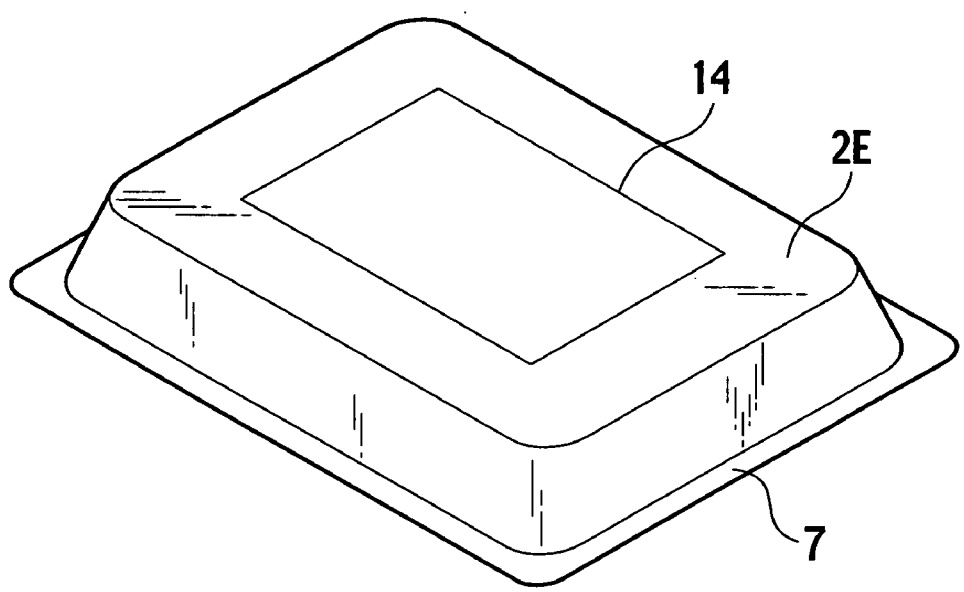
FIG. 15 is a perspective view of the electromagnetic wave shield case according to another embodiment of the present invention.

An adhesive tape 14 is adhered to the ceiling of the shield case 2E illustrated in FIG. 15, and the shield case 2E is positioned by fixing the adhesive tape 14 to the housing 9.

Figure 16:
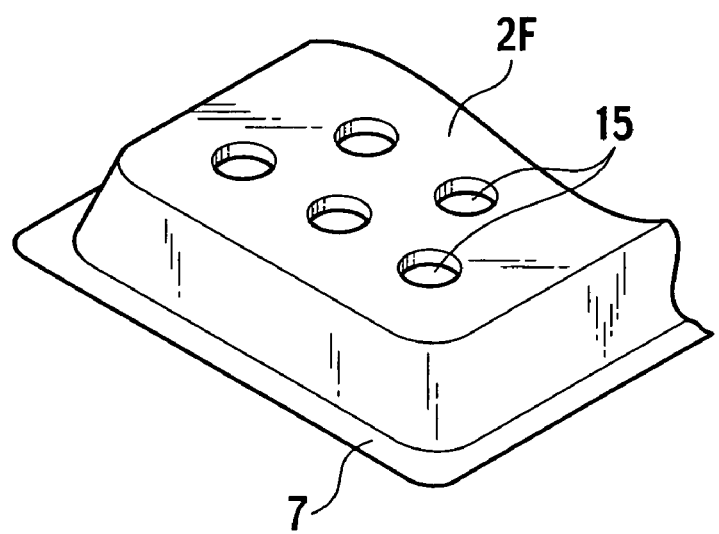
FIG. 16 is a partial perspective view of the electromagnetic wave shield case according to another embodiment of the present invention.

The shield case 2F illustrated in FIG. 16 forms a large number of uneven portions 15 on the ceiling to make the area of the surface larger. The shield case 2F has a role to radiate heat effectively from the electronic parts 6 such as a power amplifier covered with the shield case 2F.

Figure 17:
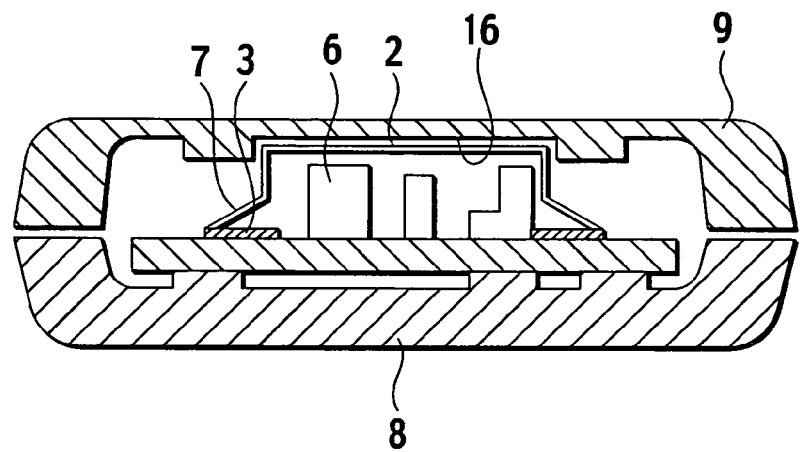
FIG. 17 is a schematic section view showing a method of positioning the electromagnetic wave shield case according to another embodiment of the present invention.

FIG. 17 shows another example of the method of positioning the shield case 2. The positioning of the shield case 2 is performed by a concave 16 corresponding to the ceiling portion of the shield case 2, which is provided on the housing 9 side. The shield case 2 is pressed by the housings 8 and 9 with the ceiling portion fitted in the concave 16.

Next, a method of manufacturing the electromagnetic wave shield case will be described.

In the method of manufacturing the electromagnetic wave shield case, for example, the shield case 2 is made by pressure forming in a supercooled liquid temperature region of the metallic glass.

In other words, in this method, the electromagnetic wave shield case is made by warm pressing in a temperature region defined in between a glass transition temperature of the metallic glass and a crystallization temperature thereof.

The metallic glass according to this embodiment is a zirconium base alloy having amorphous structure.

To be precise, the electromagnetic wave shield case is made in a supercooled liquid temperature region in which an amorphous structure can be maintained, and under the circumference where a temperature condition, in which a temperature does not reach a crystallization temperature which is an upper limit losing the amorphous structure.

A deep drawing forming using a die is performed on a foil material made of 55Zr-30Cu-5Ni-10Al (the number symbols represent an atomic ratio) metallic glass having a thickness of 0.1 mm, which is obtained by a single roller method or the like.

By such method, the aforementioned electromagnetic wave shield case according to this embodiment (shield case 2, etc) is made. Since it is necessary to suppress the generation and growth of a crystal nucleus during the course of cooling the liquid in order to supercooled liquid, a selection on the aforementioned temperature condition has to be made.

Herein, the single roller method is a method of manufacturing a metallic foil, in which alloy is dissolved by use of an electric furnace or a high-frequency furnace, melted alloy is allowed to be ejected from a tip hole of a crucible by gas pressure. The ejected alloy is contacted to a surface of a rotating cooling rotator to be solidified thereon.

At this time, if forming is performed at the supercooled liquid temperature region, various forming methods represented by a die casting method and a high pressure injection molding method can be selected without limitation to the method in which the foil material made by the single roller method.

Table below shows results obtained by comparing the formability of the flange, the obtained maximum displacement and the shield performance as to the shield case of the embodiments and the comparison examples.

following structure. Specifically, the length in the longitudinal direction is 33 mm, the length in the lateral direction is 23 mm, and the thickness is 0.1 mm. Further, the shield case has the flange 7 of 0.7 mm width integrally formed therewith in its lowermost periphery.

The shield cases of Embodiments 1 to 7 were made by performing warm pressing at the supercooled liquid temperature region for the foil material made of metallic glass (the zirconium base alloy having amorphous structure), which was made by the single roller method. The shield case of Embodiment 8 was made from the foil material made of the β-Ti alloy by use of the deep drawing forming.

As to the shield cases of Comparison Examples 1 to 4, the needle-shaped elastic springs 21 are formed by sheet metal processing method at intervals of 1 mm as in the case of the shield case 20 shown in FIG. 9A. Because it is impossible to form the flange integrally within the shield case 20 unlike in the case of the shield case 2 shown in FIG. 3.

Figure 18:
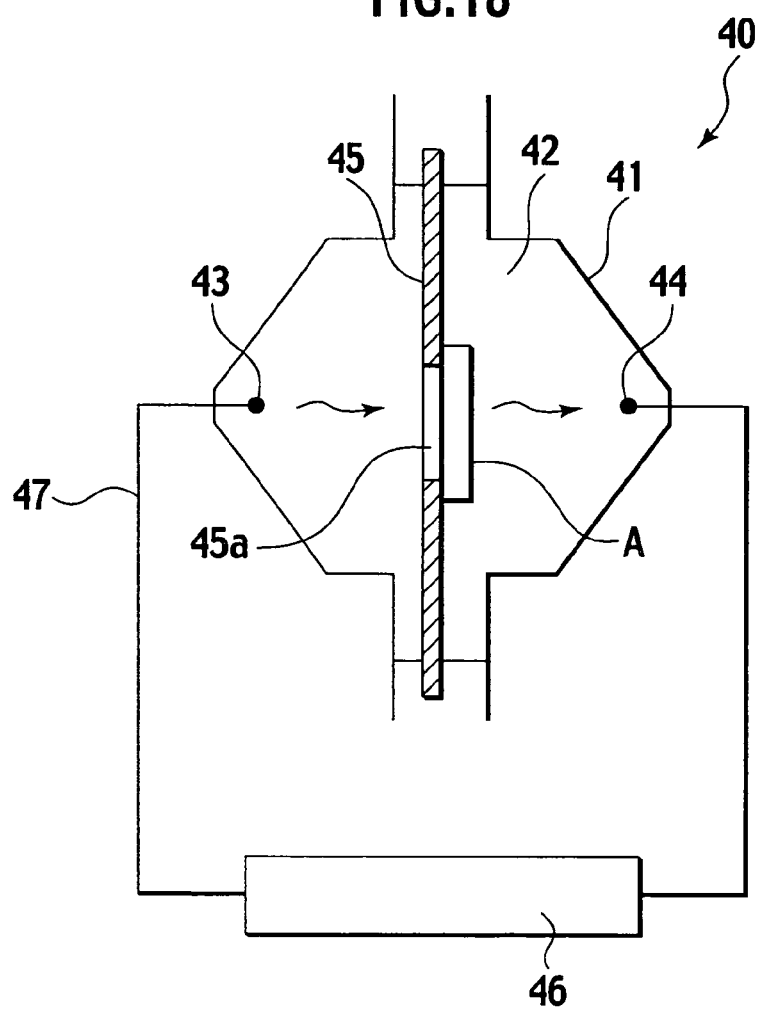
FIG. 18 is an explanatory view of a measurement system for the shield performance.

Moreover, the shield performance was measured by use of a measurement apparatus 40 shown in FIG. 18. The measurement apparatus 40 comprises a radiowave dark room 42 covered with a casing 41, a transmitting antenna 43 and a receiving antenna 44, which are provided to be opposite to each other.

In the measurement apparatus 40, a circuit board 45 having a hole 45a is located between the transmitting antenna 43 and receiving antenna 44 in the radiowave dark room 42. A tested shield case A is located in the radiowave dark room 42 so as to cover the hole 45a.

The measurement apparatus 40 comprises a network analyzer 46 and a signal circuit 47. The network analyzer 46 controls high frequencies radiated from the transmitting antenna 43, and acquires high frequencies leaking from the tested shield case A through the receiving antenna 44 to measure them.

Specifically, high frequencies ranging from 0.1 to 6 GHz were transmitted from the transmitting antenna 43, and the amount of high frequencies leaking to the outside of the tested

|  | Shield Case Material | σ f/E | Flange Formability | Max Displacement (mm) | Shield Performance | Remarks |
|---|---|---|---|---|---|---|
| Embodiment 1 | 55Zr-30Cu-5Ni-10Al | 0.019 | Good | Not less than 0.5 | Good | |
| Embodiment 2 | 52Zr-17Cu-16Ni-10Al-5Ti | 0.021 | Good | Not less than 0.5 | Good | |
| Embodiment 3 | 52Zr-17Cu-16Ni-10Al-4Ti-1Nb | 0.019 | Good | Not less than 0.5 | Good | |
| Embodiment 4 | 60Zr-20Cu-10Al-10Pd | 0.020 | Good | Not less than 0.5 | Good | |
| Embodiment 5 | 50Zr-5Ti-20Cu-5Fe-10Al-5Be | 0.021 | Good | Not less than 0.5 | Good | |
| Embodiment 6 | 57Cu-29Zr-10Ti-4Be | 0.020 | Good | Not less than 0.5 | Good | |
| Embodiment 7 | 55Ni-20Nb-20Zr-5Ti | 0.021 | Good | Not less than 0.5 | Good | |
| Embodiment 8 | β-Ti Alloy | 0.012 | Possible | Not less than 0.5 | Good | |
| Comparison 1 | SUS304 | 0.001 | Bad | 0.1 | Bad | Alternative |
| Comparison 2 | Phosphor Bronze (C51900) | 0.007 | Bad | 0.3 | with Problem | Formation of Spring Piece at |
| Comparison 3 | 7075-T6 Aluminum Alloy | 0.008 | Bad | 0.2 | Problem | |
| Comparison 4 | JIS2 class Ti | 0.002 | Bad | 0.1 | Bad | Intervals of 1 mm |

The flange formability means whether the flange having a width of 0.7 mm can be formed without producing cracks. In the shield performance, "Good" means an effective shield amount SE for high frequencies ranging from 0.1 to 6 GHz satisfies SE<−60 dB. "With Problem" means the effective shield amount SE satisfies −60 dB<SE<−30 dB. "Bad" means the effective shield amount SE satisfies −30 dB<SE.

The type of a shield case of Embodiments 1 to 8 is same as the shield case 2 shown in FIG. 3. The shield case 2 has the shield case A was measured through the receiving antenna 44, whereby the shield performance was evaluated.

As to the shield cases of Embodiments 1 to 8, in measuring the shield performance, the shield case was pressed to the circuit board 45 to be fixed thereto within the displacement of 0.5 mm of the flange 7. On the other hand, as to the shield cases of Comparison Examples 1 to 4, the shield case was slightly pressed to the circuit board 45 to be fixed thereto within a range where spring pieces were deformed permanently and were not broken down.

As is clear from the Table, the shield cases of Embodiments 1 to 8 were capable of obtaining a good effective shield amount SE of −60 dB. However, the shield cases of Comparison Examples 1 to 4 were incapable of achieving sufficient shield effects.

(Operation and Effect)

As described above, for the shield case 2, it is understood how useful the shield case 2 is made of metallic material or metallic glass having the value (ratio) of about 0.01 or more (not less than 0.01) expressed by the fracture strength (σf)/ elastic constant (E).

To be precise, according to this embodiment, since the height of the shield case 2 is low and the flare width of the flange 7 is small. Therefore, the plurality of shield case 2 (for example, the shield case 2S, 2M and 2L, shown in FIG. 10), which is adjacent to each other more densely than the conventional solder joint, can be arranged.

The flange 7 can obtain a large displacement which is necessary to obtain a reliable shield, i.e., an electrical connection. Therefore, according to the shield case of this embodiment, it is possible to obtain a good shield performance for shielding electromagnetic waves.

Further, to fit the shield case 2 to the circuit board 1, the through hole, which has been heretofore necessary, is unnecessary. Therefore, the shield case 2 is easily attached to and detached from the circuit board 1. When the shield case 2 is fitted to the circuit board 1, complicated processes are not required, and the shield case 2 is cheap. Moreover, the shield case 2 is easily used as a recycled product.

Since the shield case according to this embodiment is made of metallic materials having the value (ratio) of about 0.01 or more (not less than 0.01) expressed by the fracture strength (σf)/elastic constant (E), it is possible to utilize a deformation due to viscous flowing on the atomic level, which is different from a plastic deformation. Thus it is possible to form a high precision flange without a spring-back.

Accordingly, the electromagnetic wave shield case having the hyper-elastic flange integrally formed therewith can be provided, which needs no through hole and is capable of securing a large elastic spring displacement while decreasing the occupied area for grounding.

According to this embodiment, the interval between the two shield cases adjacent to each other can be narrowed to 2 mm at most. Thus, it is possible to cope with the restriction with respect to space on the circuit board 1.

According to this embodiment, the spring constant of the flange 7 can be controlled by the number of cuts 10. It is therefore possible to make the grounding of the flange 7 and the metallic ground line 3 perfectly. Further, it is possible to achieve easiness in attachment and detachment of the housings 8 and 9 for housing the circuit board 1 and the shield case 2A.

According to this embodiment, the circumferential length of the flange 7 is long by forming the external periphery portion 11 of the flange 7 to be shaped with nonlinear lines. Therefore, the frictional force exerted between the flange 7 and the metallic ground line 3 (grounding conduction portion) becomes large, and lateral sliding of the flange 7 can be prevented.

According to this embodiment, since the shield case is made of metallic glass, it is possible to form high precision flange without a spring-back.

Thus, the electromagnetic wave shield case having the hyper-elastic flange integrally formed therewith can be provided. Further, the electromagnetic wave shield case, which needs no through hole, and is capable of securing a large elastic spring displacement, which has not been heretofore present, can also be provided, while decreasing the occupied area for grounding.

According to the method of manufacturing the electromagnetic wave shield case of the embodiment, various forming methods represented by a die casting method and a high pressure injection molding method can be selected without limitation to the method in which the foil material is deep-drawn using the single roller method. Thus, it is possible to easily mold the shield case, which has a dome shape, other shapes including a nonsymmetrical shape, or which has the flange having an external periphery portion with nonlinear lines, without limitation of the shape of the shield case to the box shape.

The present invention was described by the embodiments in detail. It is apparent that the present invention is not limited to the embodiments described in the specification of this application. The present invention can be carried out as various modifications without departing from the scope and spirit of the present invention, which is defined by the claims attached.

What is claimed is:

1. An electromagnetic wave shield case comprising:
   a shield case body covering electronic parts on a circuit board, said shield case body comprising an upper surface and side surfaces that collectively form a single continuous body having a single lower opening delimited by said side surfaces; and
   a flange formed integrally with said shield case body,
   wherein the entirety of said shield case body and said flange are made of nonmagnetic metallic glass having a fracture strength/elastic constant value of more than 0.012,
   wherein said flange is elastically deformed to be grounded to a grounding conduction portion on said circuit board to prevent a leakage of electromagnetic waves to outside of said electromagnetic wave shield case, wherein said flange is tapered at an angle less than 90° prior to being elastically deformed, and
   wherein said shield case body and said flange provide a shield amount SE of at least −60 dB.

2. The electromagnetic wave shield case according to claim 1, wherein said flange has a flare width of 1 mm or less.

3. The electromagnetic wave shield case according to claim 2, wherein said flange has at least one cut along a direction of said flare width.

4. The electromagnetic wave shield case according to claim 1, wherein said flange has a nonlinear external periphery portion.

5. The electromagnetic wave shield case according to claim 1, wherein said nonmagnetic metallic glass is a zirconium base alloy having amorphous structure.

6. The electromagnetic wave shield case according to claim 5, wherein said zirconium base alloy is a Zr—Cu—Ni—Al alloy.

7. The electromagnetic wave shield case according to claim 1, wherein said shield case body is formed by pressure forming said nonmagnetic metallic glass in a supercooled liquid temperature region of said nonmagnetic metallic glass.

8. The electromagnetic wave shield case according to claim 7, wherein said nonmagnetic metallic glass is a zirconium base alloy having an amorphous structure.

9. The electromagnetic wave shield case according to claim 1, wherein said shield case body is formed by warm pressing said nonmagnetic metallic glass in a temperature region defined in between a glass transition temperature and a crystallization temperature of said nonmagnetic metallic glass.

10. The electromagnetic wave shield case according to claim 9, wherein said nonmagnetic metallic glass is a zirconium base alloy having an amorphous structure.

11. The electromagnetic wave shield case according to claim 1, wherein said nonmagnetic metallic glass is hyperelastic and cannot be permanently deformed.

12. The electromagnetic wave shield case according to claim 1, wherein said nonmagnetic metallic glass is a Ni—Nb—Zr—Ti alloy.

13. The electromagnetic wave shield case according to claim 1, wherein said nonmagnetic metallic glass is a Cu—Zr—Ti—Be alloy.

14. The electromagnetic wave shield case according to claim 1, wherein said nonmagnetic metallic glass is a Cu—Zr—Ti alloy.

15. The electromagnetic wave shield case according to claim 1, wherein said nonmagnetic metallic glass is Mg glass.

* * * * *